(12) United States Patent
Hwang et al.

(10) Patent No.: US 9,385,838 B2
(45) Date of Patent: Jul. 5, 2016

(54) ENCODING METHOD AND ENCODING APPARATUS IN A WIRELESS COMMUNICATIONS SYSTEM

(71) Applicant: LG ELECTRONICS INC., Seoul (KR)

(72) Inventors: Daesung Hwang, Anyang-si (KR); Joonkui Ahn, Anyang-si (KR); Dongyoun Seo, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 59 days.

(21) Appl. No.: 14/399,864

(22) PCT Filed: May 10, 2013

(86) PCT No.: PCT/KR2013/004192
§ 371 (c)(1),
(2) Date: Nov. 7, 2014

(87) PCT Pub. No.: WO2013/169085
PCT Pub. Date: Nov. 14, 2013

(65) Prior Publication Data
US 2015/0106681 A1    Apr. 16, 2015

Related U.S. Application Data

(60) Provisional application No. 61/645,060, filed on May 10, 2012.

(51) Int. Cl.
*H04L 1/18* (2006.01)
*H04L 1/00* (2006.01)
(Continued)

(52) U.S. Cl.
CPC ........... *H04L 1/0061* (2013.01); *H03M 13/356* (2013.01); *H03M 13/6306* (2013.01);
(Continued)

(58) Field of Classification Search
CPC ... H04L 1/0061; H04L 1/0031; H04L 1/0041; H04L 5/0055; H04W 72/0413; H03M 13/356; H03M 13/6306; H03M 13/09
See application file for complete search history.

(56) References Cited

U.S. PATENT DOCUMENTS 8,549,374 B2 * 10/2013 Yin ..................... H03M 13/136
                                                    370/329
8,769,365 B2 *  7/2014 Buckley ................ H04L 1/0026
                                                    714/748
(Continued)

FOREIGN PATENT DOCUMENTS

KR     10-2010-0086920 A    8/2010
KR        10-1061116 B1     8/2011
WO     WO 2012/015217 A2    2/2012

OTHER PUBLICATIONS

LG Electronics, "Channel Coding for UCI on PUSCH," 3GPP TSG RAN WG1 #63, R1-106106, Jacksonville, USA, Nov. 15-19, 2010 (retrieved on Nov. 10, 2010), XP50489781, pp. 1-4.
3GPP TS 36.212 V10.4.0, "3GPP; TSG RAN; E-UTRA; Multiplexing and channel coding (Release 10)", Dec. 2011, (http://www.3gpp.org/ftp/Specs/html-info/36212.htm), See pp. 22 and 23.

*Primary Examiner* — Shelly A Chase
(74) *Attorney, Agent, or Firm* — Birch, Stewart, Kolasch & Birch, LLP

(57) ABSTRACT

Provided are an encoding method and an encoding apparatus in a wireless communications system. The encoding apparatus generates an error detection code for a first UCI (uplink control information), and adds the error detection code to a second UCI. The encoding apparatus encodes the first UCI, and then the second UCI added with the error detection code.

13 Claims, 7 Drawing Sheets

(A)

(B)

(C)

(51) Int. Cl.
- *H03M 13/00* (2006.01)
- *H04L 5/00* (2006.01)
- *H04W 72/04* (2009.01)
- *H04W 72/08* (2009.01)
- *H03M 13/35* (2006.01)
- *H03M 13/09* (2006.01)
- *H03M 13/13* (2006.01)
- *H03M 13/23* (2006.01)

(52) U.S. Cl.
CPC ......... *H03M13/6525* (2013.01); *H04L 1/0041* (2013.01); *H04L 5/0091* (2013.01); *H04W 72/0413* (2013.01); *H04W 72/085* (2013.01); *H03M 13/09* (2013.01); *H03M 13/098* (2013.01); *H03M 13/136* (2013.01); *H03M 13/23* (2013.01)

(56) References Cited

U.S. PATENT DOCUMENTS

| | | | |
|---|---|---|---|
| 9,043,667 B2 * | 5/2015 | Blankenship | H03M 13/136 714/748 |
| 9,054,846 B2 * | 6/2015 | Falahati | H04L 5/0055 |
| 9,106,368 B2 * | 8/2015 | Suzuki | H04L 5/0007 |
| 9,197,359 B2 * | 11/2015 | Aiba | H03M 13/136 |
| 2006/0062217 A1 | 3/2006 | Kim et al. | |
| 2009/0006925 A1 | 1/2009 | Pan | |
| 2010/0008294 A1 | 1/2010 | Palanki et al. | |
| 2013/0100918 A1 * | 4/2013 | Hong | H04L 5/001 370/329 |
| 2013/0121302 A1 | 5/2013 | Yang et al. | |

* cited by examiner (A)

(B)

(C)

ENCODING METHOD AND ENCODING APPARATUS IN A WIRELESS COMMUNICATIONS SYSTEM

CROSS REFERENCE TO RELATED APPLICATIONS

This application is the National Phase of PCT International Application No. PCT/KR2013/004192, filed on May 10, 2013, which claims priority under 35 U.S.C. 119(e) to U.S. Provisional Application No. 61/645,060, filed on May 10, 2012, all of which are hereby expressly incorporated by reference into the present application.

BACKGROUND OF THE INVENTION

1. Field of the Invention

The present invention relates to wireless communications, and more particularly, to an encoding method and encoding apparatus for uplink control information in a wireless communication system.

2. Related Art $3^{rd}$ generation partnership project (3GPP) long term evolution (LTE) evolved from a universal mobile telecommunications system (UMTS) is introduced as the 3GPP release 8. The 3GPP LTE uses orthogonal frequency division multiple access (OFDMA) in a downlink, and uses single carrier-frequency division multiple access (SC-FDMA) in an uplink. The 3GPP LTE employs multiple input multiple output (MIMO) having up to four antennas. In recent years, there is an ongoing discussion on 3GPP LTE-advanced (LTE-A) evolved from the 3GPP LTE.

As disclosed in 3GPP TS 36.211 V10.4.0 (2011-12) "Evolved Universal Terrestrial Radio Access (E-UTRA); Physical Channels and Modulation (Release 10)", a physical channel of the LTE can be classified into a downlink channel, i.e., a physical downlink shared channel (PDSCH) and a physical downlink control channel (PDCCH), and an uplink channel, i.e., a physical uplink shared channel (PUSCH) and a physical uplink control channel (PUCCH).

The uplink channel is used to transmit a variety of uplink control information such as hybrid automatic repeat request (HARQ) positive-acknowledgement (ACK)/negative-acknowledgement (NACK), channel state information (CSI), and scheduling request (SR).

With the introduction of a scheme of increasing channel capacity such as multiple input multiple output (MIMO) and carrier aggregation (CA), an amount of uplink control information is also increased. A radio resource for an uplink channel may be more restrictive than a radio resource for a downlink channel, and a transmission error of the uplink control information may aggravate service quality.

There is a need to design a coding and transmission scheme for an uplink channel according to an increasing amount of the uplink control information.

SUMMARY OF THE INVENTION

The present invention provides an encoding method and encoding apparatus for uplink control information.

In an aspect, an encoding method in a wireless communication system includes generating an error detection code for first uplink control information (UCI), attaching the error detection code to second UCI, encoding the first UCI, and encoding the second UCI to which the error detection code is attached.

The error detection code may include a parity bit or a cyclic redundancy check (CRC).

The first UCI and the second UCI may be encoded based on different Reed-Muller (RM) codes.

The first UCI may include a rank indicator (RI), and the second UCI may include channel state information (CSI).

In another aspect, an encoding apparatus in a wireless communication system includes an uplink control information (UCI) generator configured to generate an error detection code for first UCI and attach the error detection code to second UCI, a first encoder configured to encode the first UCI, and a second encoder configured to encode the second UCI to which the error detection code is attached.

A variety of types and an increased amount of uplink control information can be transmitted, and an error detection performance can be increased.

DESCRIPTION OF EXEMPLARY EMBODIMENTS

A wireless device may be fixed or mobile, and may be referred to as another terminology, such as a user equipment (UE), a mobile station (MS), a user terminal (UT), a subscriber station (SS), a mobile terminal (MT), etc. A base station (BS) is generally a fixed station that communicates with the wireless device and may be referred to as another terminology, such as an evolved node-B (eNB), a base transceiver system (BTS), an access point, etc.

Hereinafter, the present invention is applied based on a $3^{rd}$ generation partnership project (3GPP) long term evolution (LTE) or a 3GPP LTE-Advanced (LTE-A). This is for exemplary purposes only, and thus the present invention is applicable to various communication systems. In the following description, LTE and/or LTE-A are collectively referred to as LTE.

The wireless device may be served by a plurality of serving cells. Each serving cell may be defined with a downlink (DL) component carrier (CC) or a pair of a DL CC and an uplink (UL) CC.

The serving cell may be classified into a primary cell and a secondary cell. The primary cell operates at a primary frequency, and is a cell designated as the primary cell when an initial network entry process is performed or when a network re-entry process starts or in a handover process. The primary cell is also called a reference cell. The secondary cell operates at a secondary frequency. The secondary cell may be configured after a radio resource control (RRC) connection is established, and may be used to provide an additional radio resource. At least one primary cell is configured always. The secondary cell may be added/modified/released by using higher-layer signaling (e.g., an RRC message).

A cell index (CI) of the primary cell may be fixed. For example, a lowest CI may be designated as a CI of the primary cell. It is assumed hereinafter that the CI of the primary cell is 0 and a CI of the secondary cell is allocated sequentially starting from 1.

Figure 1:
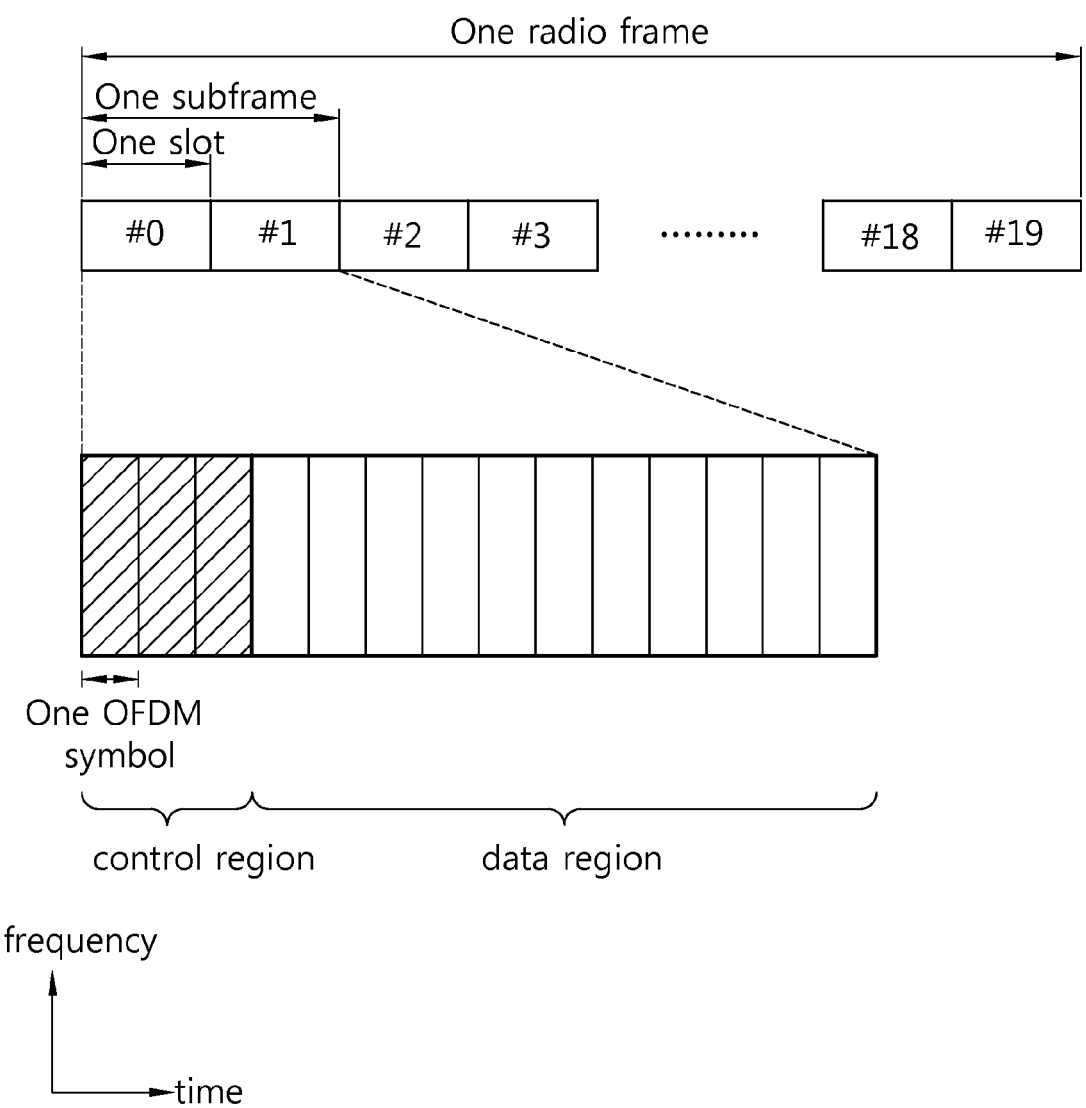
FIG. 1 shows a downlink radio frame structure in $3^{rd}$ generation partnership project (3GPP) long term evolution (LTE).

FIG. 1 shows a structure of a DL radio frame in 3GPP LTE. The section 4 of 3GPP TS 36.211 V10.4.0 (2011-12) "Evolved Universal Terrestrial Radio Access (E-UTRA); Physical Channels and Modulation (Release 10)" may be incorporated herein by reference.

A radio frame includes 10 subframes indexed with 0 to 9. One subframe includes 2 consecutive slots. A time required for transmitting one subframe is defined as a transmission time interval (TTI). For example, one subframe may have a length of 1 millisecond (ms), and one slot may have a length of 0.5 ms.

One slot may include a plurality of orthogonal frequency division multiplexing (OFDM) symbols in a time domain. Since the 3GPP LTE uses orthogonal frequency division multiple access (OFDMA) in a downlink (DL), the OFDM symbol is only for expressing one symbol period in the time domain, and there is no limitation in a multiple access scheme or terminologies. For example, the OFDM symbol may also be referred to as another terminology such as a single carrier frequency division multiple access (SC-FDMA) symbol, a symbol period, etc.

Although it is described that one slot includes 7 OFDM symbols for example, the number of OFDM symbols included in one slot may vary depending on a length of a cyclic prefix (CP). According to 3GPP TS 36.211 V10.4.0, in case of a normal CP, one slot includes 7 OFDM symbols, and in case of an extended CP, one slot includes 6 OFDM symbols.

A resource block (RB) is a resource allocation unit, and includes a plurality of subcarriers in one slot. For example, if one slot includes 7 OFDM symbols in a time domain and the RB includes 12 subcarriers in a frequency domain, one RB can include 7×12 resource elements (REs).

A DL subframe is divided into a control region and a data region in the time domain. The control region includes up to first four OFDM symbols of a first slot in the subframe. However, the number of OFDM symbols included in the control region may vary. A physical downlink control channel (PDCCH) and other control channels are allocated to the control region, and a physical downlink shared channel (PDSCH) is allocated to the data region.

As described in 3GPP TS 36.211 V10.4.0, in 3GPP LTE, a physical channel may be divided into a data channel and a control channel. The data channel may be a physical downlink shared channel (PDSCH) and a physical uplink shared channel (PUSCH). The control channel may be a physical downlink control channel (PDCCH), a physical control format indicator channel (PCFICH), a physical hybrid-ARQ indicator channel (PHICH), and a physical uplink control channel (PUCCH).

The PCFICH transmitted in a first OFDM symbol of the subframe carries a control format indicator (CFI) regarding the number of OFDM symbols (i.e., a size of the control region) used for transmission of control channels in the subframe. A wireless device first receives the CFI on the PCFICH, and thereafter monitors the PDCCH.

Unlike the PDCCH, the PCFICH does not use blind decoding, and is transmitted by using a fixed PCFICH resource of the subframe.

The PHICH carries a positive-acknowledgement (ACK)/negative-acknowledgement (NACK) signal for an uplink hybrid automatic repeat request (HARQ). The ACK/NACK signal for uplink (UL) data on a PUSCH transmitted by the wireless device is transmitted on the PHICH.

A physical broadcast channel (PBCH) is transmitted in first four OFDM symbols in a second slot of a first subframe of a radio frame. The PBCH carries system information necessary for communication between the wireless device and a BS. The system information transmitted through the PBCH is referred to as a master information block (MIB). In comparison thereto, system information transmitted on the PDCCH is referred to as a system information block (SIB).

Control information transmitted through the PDCCH is referred to as downlink control information (DCI). The DCI may include resource allocation of the PDSCH (this is referred to as a downlink (DL) grant), resource allocation of a PUSCH (this is referred to as an uplink (UL) grant), a set of transmit power control commands for individual UEs in any UE group, and/or activation of a voice over Internet protocol (VoIP).

In 3GPP LTE, blind decoding is used to detect a PDCCH. The blind decoding is a scheme in which a desired identifier is de-masked from a cyclic redundancy check (CRC) of a received PDCCH (referred to as a candidate PDCCH) to determine whether the PDCCH is its own control channel by performing CRC error checking. ABS determines a PDCCH format according to DCI to be transmitted to a wireless device, attaches a cyclic redundancy check (CRC) to control information, and masks a unique identifier (referred to as a radio network temporary identifier (RNTI)) to the CRC according to an owner or usage of the PDCCH.

According to 3GPP TS 36.211 V10.4.0, an uplink channel includes a PUSCH, a PUCCH, a sounding reference signal (SRS), and a physical random access channel (PRACH).

Figure 2:
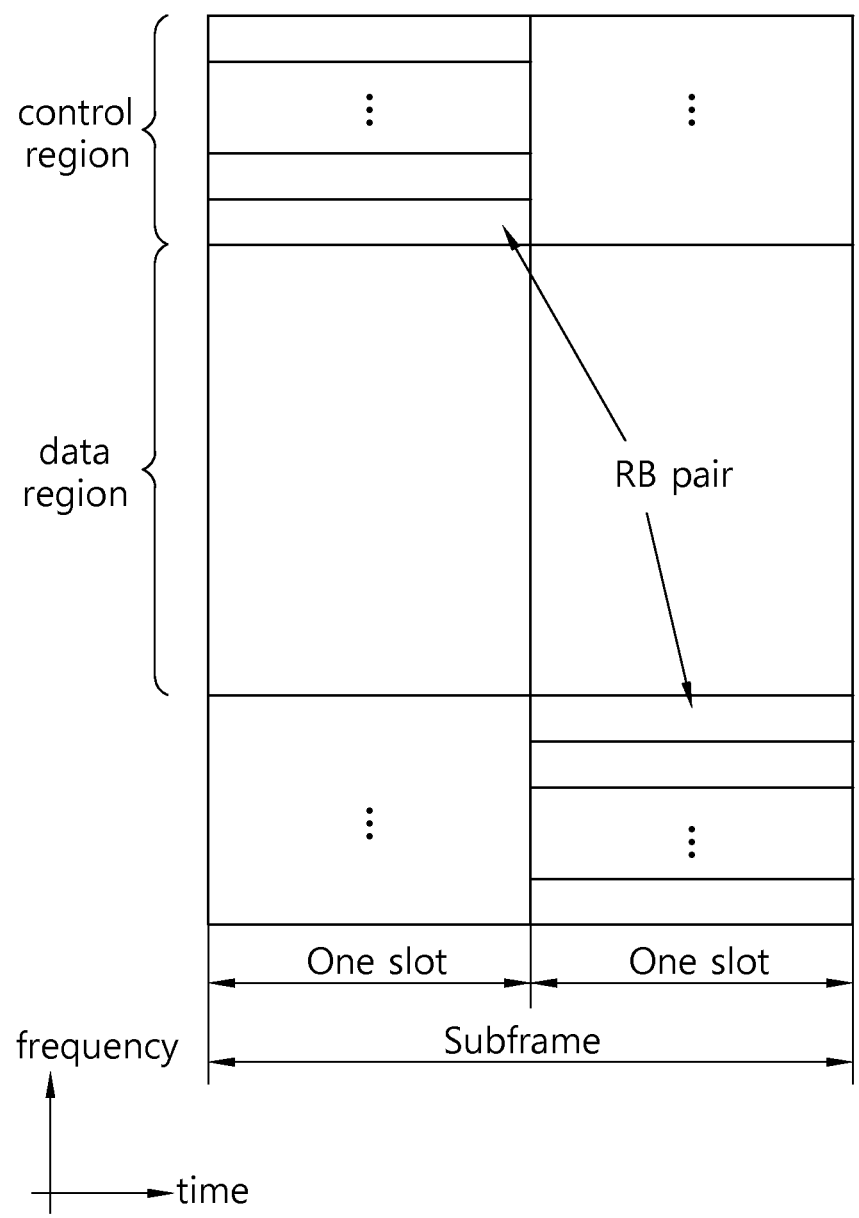
FIG. 2 shows a structure of an uplink (UL) subframe in 3GPP LTE.

FIG. 2 shows a structure of a UL subframe in 3GPP LTE.

A UL subframe can be divided into a control region and a data region. The control region is a region to which a physical uplink control channel (PUCCH) carrying UL control information is allocated. A data region is a region to which a physical uplink shared channel (PUSCH) carrying user data is allocated.

The PUCCH is allocated in an RB pair in a subframe. RBs belonging to the RB pair occupy different subcarriers in each of a $1^{st}$ slot and a $2^{nd}$ slot. m is a location index indicating a logical frequency-domain location of the RB pair allocated to the PUCCH in the subframe.

It shows that RBs having the same value m occupy different subcarriers in the two slots.

The PUSCH is allocated by a UL grant on a PDCCH. Although not shown, a $4^{th}$ OFDM symbol of each slot of a normal CP is used in transmission of a demodulation reference signal (DM RS).

Uplink control information (UCI) includes at least any one of HARQ ACK/NACK, channel state information (CSI), and scheduling request (SR). Hereinafter, as an index of indicating a state of a DL channel, the CSI may include at least any one of a channel quality indicator (CQI) and a precoding matrix indicator (PMI).

PUCCH formats are defined as below in order to represent combinations of UCI and PUCCH and various PUCCH transmissions.

TABLE 1

| PUCCH format | UCI to be transmitted |
| --- | --- |
| PUCCH format 1 | Positive SR |
| PUCCH format 1a/1b | 1 bit or 2 bits HARQ ACK/NACK |
| PUCCH format 2 | CSI reporting |
| PUCCH format 2a/2b | CSI reporting and 1 bit or 2 bits HARQ ACK/NACK |
| PUCCH format 3 | HARQ ACK/NACK, SR, CSI |

A PUCCH format 3 carries 48 bits encoded UCI. The PUCCH format 3 may carry HARQ ACK/NACKs for a plurality of serving cells and CSI for one serving cell.

Figure 3:
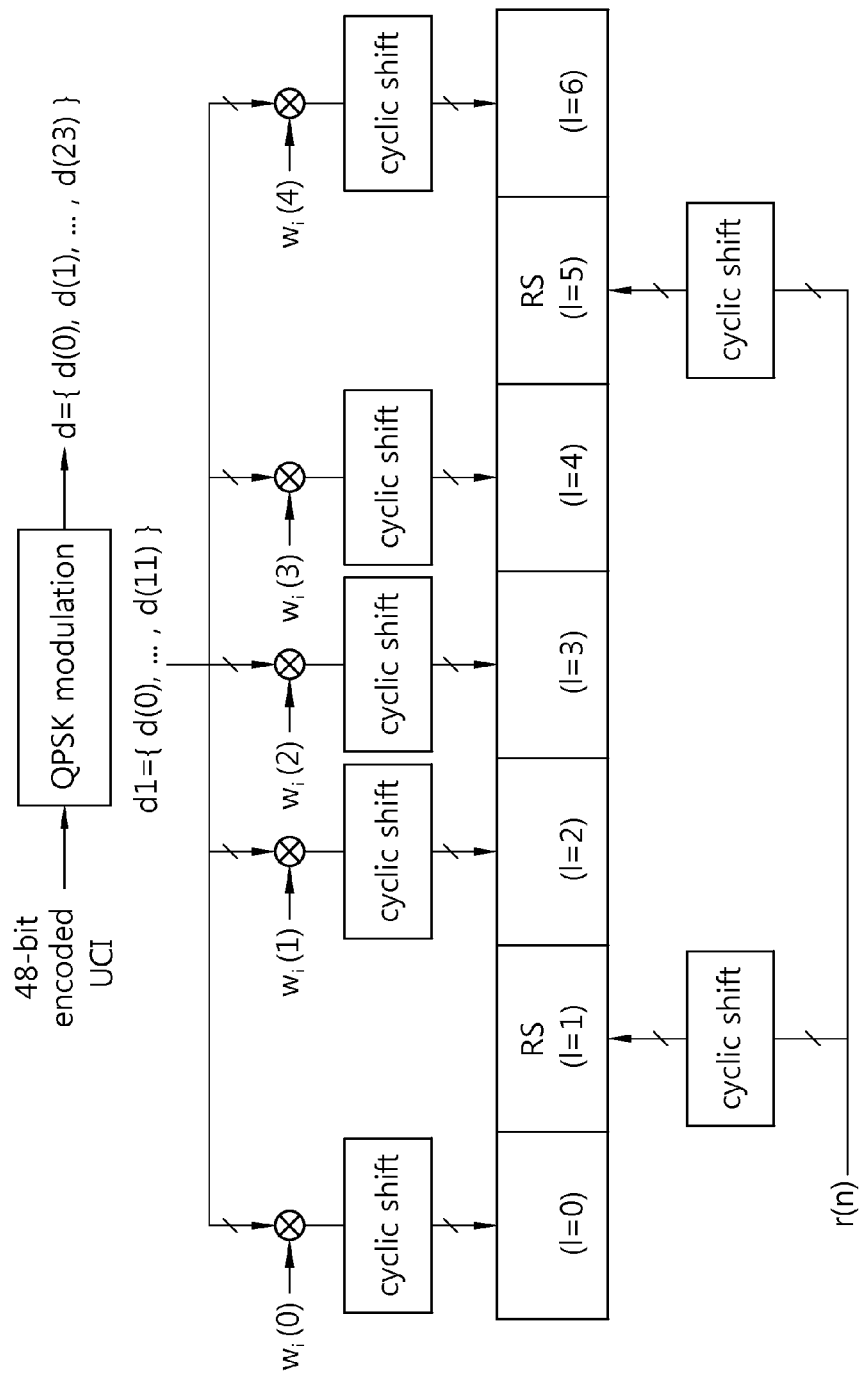
FIG. 3 shows an example of a structure of a physical uplink control channel (PUCCH) format 3 in a normal cyclic prefix (CP) case.

FIG. 3 shows an example of a structure of a PUCCH format 3 in a normal CP case.

One slot includes 7 OFDM symbols. l denotes an OFDM symbol number in the slot, and has a value in the range of 0 to 6. Two OFDM symbols with l=1, 5 are used as RS OFDM symbols for a reference signal, and the remaining OFDM symbols are used as data OFDM symbols for a UCI signal.

A symbol sequence d={d(0), d(1), ... d(23)} is generated by performing QPSK modulation on a 48-bit encoded UCI (e.g., encoded ACK/NACK). d(n)(n=0, 1, . . . , 23) is a complex-valued modulation symbol. The symbol sequence d can be regarded as a set of modulation symbols. The number of bits of the UCI or a modulation scheme is for exemplary purposes only, and thus the present invention is not limited thereto.

Figure 4:
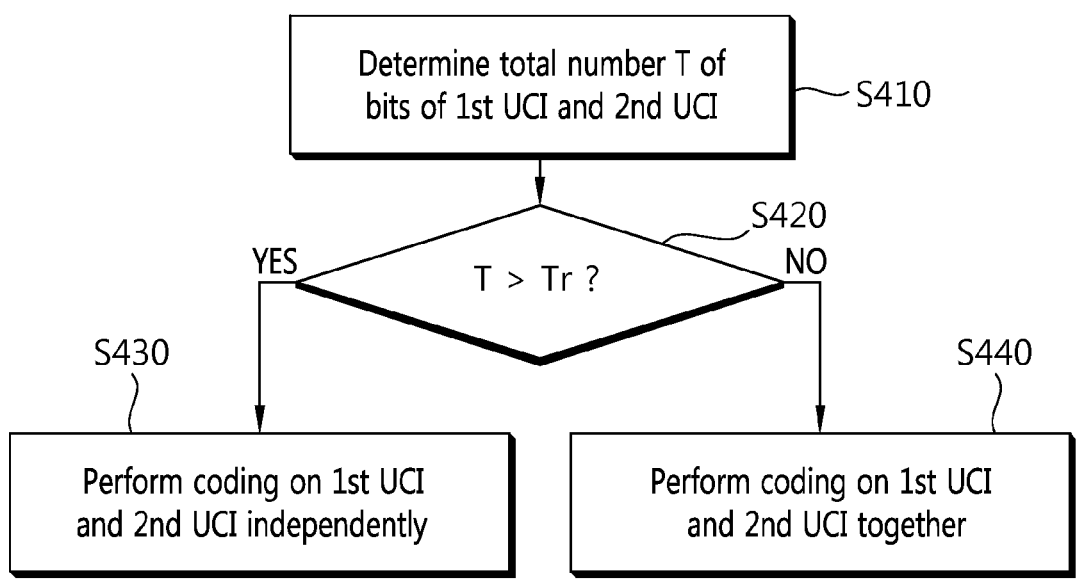
FIG. 4 shows uplink control information (UCI) coding according to an embodiment of the present invention.

One PUCCH uses one RB, and one subframe includes a first slot and a second slot. A symbol sequence d={d(0), d(1), . . . , d(23)} is divided into two sequences d1={d(0), . . . , d(11)} and d2={d(12), . . . , d(23)}, each having a length of 12. The first sequence d1 is transmitted in the first slot, and the second sequence d2 is transmitted in the second slot. In FIG. 4, the first sequence d1 is transmitted in the first slot.

The symbol sequence is spread with an orthogonal sequence $w_i$. Symbol sequences are mapped to respective data OFDM symbols. An orthogonal sequence is used to identify a PUCCH (or UE) by spreading the symbol sequence across the data OFDM symbols.

Two RS OFDM symbols are transmitted by mapping an RS sequence used for demodulation of UCI.

Now, UCI coding in 3GPP LTE is described with reference to the section 5 of 3GPP TS 36.212 V10.4.0 (2011-12) "Evolved Universal Terrestrial Radio Access (E-UTRA); Multiplexing and channel coding (Release 10)".

CSI, rank indicator (RI), and HARQ ACK/NACK are coded independently

First, CSI coding for a PUSCH is described.

CSI $o_0, o_1, \ldots, o_{O-1}$ (where O is the number of bits of the CSI) is subjected to channel coding to generate a control information bit sequence $q_0, q_1, \ldots, q_{N_L Q_{CQI}-1}$. $N_L$ denotes the number of layers to which a UL transport block is mapped, and $Q_{CQI}$ denotes the number of bits for each layer that can be used for the CSI.

For example, a (32, O) block code (also referred to as a Reed-Muller (RM) code) may be used as channel coding for the CSI.

$b_0, b_1, \ldots b_{31}$ denote an intermediate sequence for CQI channel coding and can be generated by the following equation.

$$b_i = \sum_{n=0}^{O-1} (o_n \cdot M_{i,n}) \bmod 2 \qquad \text{[Equation 1]}$$

Herein, i=0, 1, . . . , 31. $M_{i,n}$ is a basis sequence for the (32, O) block code, and may be defined as the following table.

TABLE 2

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ |
| --- | --- | --- | --- | --- | --- | --- | --- | --- | --- | --- | --- |
| 0 | 1 | 1 | 0 | 0 | 0 | 0 | 0 | 0 | 0 | 0 | 1 |
| 1 | 1 | 1 | 1 | 0 | 0 | 0 | 0 | 0 | 0 | 1 | 1 |
| 2 | 1 | 0 | 0 | 1 | 0 | 0 | 1 | 0 | 1 | 1 | 1 |
| 3 | 1 | 0 | 1 | 1 | 0 | 0 | 0 | 0 | 1 | 0 | 1 |
| 4 | 1 | 1 | 1 | 1 | 0 | 0 | 0 | 1 | 0 | 0 | 1 |
| 5 | 1 | 1 | 0 | 0 | 1 | 0 | 1 | 1 | 1 | 0 | 1 |
| 6 | 1 | 0 | 1 | 0 | 1 | 0 | 1 | 0 | 1 | 1 | 1 |
| 7 | 1 | 0 | 0 | 1 | 1 | 0 | 0 | 1 | 1 | 0 | 1 |
| 8 | 1 | 1 | 0 | 1 | 1 | 0 | 0 | 1 | 0 | 1 | 1 |
| 9 | 1 | 0 | 1 | 1 | 1 | 0 | 1 | 0 | 0 | 1 | 1 |
| 10 | 1 | 0 | 1 | 0 | 0 | 1 | 1 | 1 | 0 | 1 | 1 |
| 11 | 1 | 1 | 1 | 0 | 0 | 1 | 1 | 0 | 1 | 0 | 1 |
| 12 | 1 | 0 | 0 | 1 | 0 | 1 | 0 | 1 | 1 | 1 | 1 |
| 13 | 1 | 1 | 0 | 1 | 0 | 1 | 0 | 1 | 0 | 1 | 1 |
| 14 | 1 | 0 | 0 | 0 | 1 | 1 | 0 | 1 | 0 | 0 | 1 |
| 15 | 1 | 1 | 0 | 0 | 1 | 1 | 1 | 1 | 0 | 1 | 1 |
| 16 | 1 | 1 | 1 | 0 | 1 | 1 | 1 | 0 | 0 | 1 | 0 |
| 17 | 1 | 0 | 0 | 1 | 1 | 1 | 0 | 0 | 1 | 0 | 0 |
| 18 | 1 | 1 | 0 | 1 | 1 | 1 | 1 | 0 | 0 | 0 | 0 |
| 19 | 1 | 0 | 0 | 0 | 0 | 1 | 1 | 0 | 0 | 0 | 0 |
| 20 | 1 | 0 | 1 | 0 | 0 | 0 | 1 | 0 | 0 | 0 | 1 |
| 21 | 1 | 1 | 0 | 1 | 0 | 0 | 0 | 0 | 0 | 1 | 1 |
| 22 | 1 | 0 | 0 | 0 | 1 | 0 | 0 | 1 | 1 | 0 | 1 |
| 23 | 1 | 1 | 1 | 0 | 1 | 0 | 0 | 0 | 1 | 1 | 1 |
| 24 | 1 | 1 | 1 | 1 | 0 | 1 | 1 | 1 | 1 | 1 | 0 |
| 25 | 1 | 1 | 0 | 0 | 0 | 1 | 1 | 1 | 0 | 0 | 1 |
| 26 | 1 | 0 | 1 | 1 | 0 | 1 | 0 | 0 | 1 | 1 | 0 |
| 27 | 1 | 1 | 1 | 1 | 0 | 0 | 1 | 0 | 1 | 1 | 0 |
| 28 | 1 | 0 | 1 | 0 | 1 | 1 | 1 | 0 | 1 | 0 | 0 |
| 29 | 1 | 0 | 1 | 1 | 1 | 1 | 1 | 1 | 1 | 0 | 0 |
| 30 | 1 | 1 | 1 | 1 | 1 | 1 | 1 | 1 | 1 | 1 | 1 |
| 31 | 1 | 0 | 0 | 0 | 0 | 0 | 0 | 0 | 0 | 0 | 0 |

The control information bit sequence $q_0, q_1, \ldots, q_{Q-1}$ is generated by circularly repeating the intermediate sequence $b_0, b_1, \ldots b_{31}$ according to the following equation.

$$q_i = b_{(i\bmod 32)} \quad \text{[Equation 2]}$$

Herein, $i=0, 1, \ldots, N_L Q_{CQI}-1$.

A data bit sequence $f_0, f_1, \ldots, f_{G-1}$ is multiplexed together with the CSI bit sequence into a multiplexed sequence $g_0, g_1, \ldots, g_{H-1}$. In the multiplexed symbol sequence, the CSI may be first arranged, and thereafter a UL transport block may be arranged. H denotes the total number of bits allocated to the PUSCH, and is defined as $H=G+N_L Q_{CQI}$. Herein, $q_i$ is a modulation symbol on constellation, and $H'=H/Q_m$. $Q_m$ denotes the number of bits for each modulation symbol of a modulation scheme. For example, when quadrature phase shift keying (QPSK) is used as the modulation scheme, $Q_m=2$.

Now, CSI coding for a PUCCH format 2 is described.

UCI (e.g., CSI) $u_0, u_1, \ldots u_{A-1}$ (where A is the number of bits of the UCI) is subjected to channel coding to generate an encoded bit sequence $b_0, b_1, \ldots, b_{B-1}$. B is the number of bits capable of transmitting a corresponding PUCCH. Since the PUCCH format 2 can transmit 20-bit coded UCI, B=20.

A (20, A) block code (or also referred to as a Reed-Muller (RM) code) may be used as channel coding for the PUCCH format 2. This can be expressed as follows.

$$b_i = \sum_{n=0}^{A-1} (u_n \cdot M_{i,n}) \bmod 2 \quad \text{[Equation 3]}$$

Herein, $i=0, 1, \ldots, B-1$. $M_{i,n}$ is a basis sequence for a (20, A) block code, and may be defined as the following table.

TABLE 3

| i | $M_{i,0}$ | $M_{i,1}$ | $M_{i,2}$ | $M_{i,3}$ | $M_{i,4}$ | $M_{i,5}$ | $M_{i,6}$ | $M_{i,7}$ | $M_{i,8}$ | $M_{i,9}$ | $M_{i,10}$ | $M_{i,11}$ | $M_{i,12}$ |
|---|---|---|---|---|---|---|---|---|---|---|---|---|---|
| 0 | 1 | 1 | 0 | 0 | 0 | 0 | 0 | 0 | 0 | 0 | 1 | 1 | 0 |
| 1 | 1 | 1 | 1 | 0 | 0 | 0 | 0 | 0 | 0 | 1 | 1 | 1 | 0 |
| 2 | 1 | 0 | 0 | 1 | 0 | 0 | 1 | 0 | 1 | 1 | 1 | 1 | 1 |
| 3 | 1 | 0 | 1 | 1 | 0 | 0 | 0 | 0 | 1 | 0 | 1 | 1 | 1 |
| 4 | 1 | 1 | 1 | 1 | 0 | 0 | 0 | 1 | 0 | 0 | 1 | 1 | 1 |
| 5 | 1 | 1 | 0 | 0 | 1 | 0 | 1 | 1 | 1 | 0 | 1 | 1 | 1 |
| 6 | 1 | 0 | 1 | 0 | 1 | 0 | 1 | 0 | 1 | 1 | 1 | 1 | 1 |
| 7 | 1 | 0 | 0 | 1 | 1 | 0 | 0 | 1 | 1 | 0 | 1 | 1 | 1 |
| 8 | 1 | 1 | 0 | 1 | 1 | 0 | 0 | 1 | 0 | 1 | 1 | 1 | 1 |
| 9 | 1 | 0 | 1 | 1 | 1 | 0 | 0 | 0 | 1 | 1 | 1 | 1 | 1 |
| 10 | 1 | 0 | 1 | 0 | 0 | 1 | 1 | 1 | 0 | 1 | 1 | 1 | 1 |
| 11 | 1 | 1 | 1 | 0 | 0 | 1 | 1 | 0 | 1 | 0 | 1 | 1 | 1 |
| 12 | 1 | 0 | 0 | 1 | 0 | 1 | 0 | 1 | 1 | 1 | 1 | 1 | 1 |
| 13 | 1 | 1 | 0 | 1 | 0 | 1 | 0 | 1 | 0 | 1 | 1 | 1 | 1 |
| 14 | 1 | 0 | 0 | 0 | 1 | 1 | 0 | 1 | 0 | 0 | 1 | 0 | 1 |
| 15 | 1 | 1 | 0 | 0 | 1 | 1 | 1 | 1 | 0 | 1 | 1 | 0 | 1 |
| 16 | 1 | 1 | 1 | 0 | 1 | 1 | 1 | 0 | 0 | 1 | 0 | 1 | 1 |
| 17 | 1 | 0 | 0 | 1 | 1 | 1 | 0 | 0 | 1 | 0 | 1 | 1 | 1 |
| 18 | 1 | 1 | 0 | 1 | 1 | 1 | 1 | 1 | 0 | 0 | 0 | 0 | 0 |
| 19 | 1 | 0 | 0 | 0 | 0 | 1 | 1 | 0 | 0 | 0 | 0 | 0 | 0 |

Now, RI or HARQ ACK/NACK coding is described.

UCI (e.g., RI or HARQ ACK/NACK) $u_0, u_1, \ldots, u_{A-1}$ (where A is the number of bits of the UCI) is subjected to channel coding to generate an encoded bit sequence $q_0, q_1, \ldots, q_{B-1}$. B is the number of bits capable of transmitting a corresponding PUCCH. Since the PUCCH format 3 can transmit coded UCI of 48 bits, B=48.

The PUCCH format 3 may transmit up to 48 bits, but channel coding uses a basis sequence for a (32, A) block code of Table 2. Therefore, according to whether the number A of UCI bits is greater than the number of RM bases (or also referred to as a basis sequence), coding is achieved as follows. According to Table 2, the number of RM bases is 11.

If A<=11, the following is satisfied.
An intermediary sequence $b_0, b_1, \ldots b_{31}$ for channel coding is generated as follows.

$$b_i = \sum_{n=0}^{A-1} (u_n \cdot M_{i,n}) \bmod 2 \quad \text{[Equation 4]}$$

Herein, $i=0, 1, \ldots, 31$, and $M_{i,n}$ is a basis sequence for the (32, 0) block code of Table 1.

A control information bit sequence $q_0, q_1, \ldots, q_{B-1}$ is generated by circularly repeating the intermediary sequence $b_0, b_1, \ldots, b_{31}$ as follows.

$$q_i = b_{(i \bmod 32)} \quad \text{[Equation 5]}$$

Herein, $i=0, 1, \ldots, B-1$.
If 11<A<=21, the following is satisfied.
Two intermediary sequences $b^1_i$ and $b^2_i$ are generated as follows.

$$b^1_i = \sum_{n=0}^{\lceil A/2 \rceil - 1} (u_n \cdot M_{i,n}) \bmod 2, \quad \text{[Equation 6]}$$

$$b^2_i = \sum_{n=0}^{A - \lceil A/2 \rceil - 1} (u_{\lceil A/2 \rceil + n} \cdot M_{i,n}) \bmod 2$$

Herein, $i=0, 1, \ldots, 23$.

The control information bit sequence $q_0, q_1, \ldots, q_{B-1}$ is obtained by concatenating the intermediary sequences.

$$q_i = b^1_j, q_{i+1} = b^1_{j+1}, q_{i+2} = b^2_j, q_{i+4} = b^2_{j+1} \quad \text{[Equation 7]}$$

If A<=1 11, since one RM block code (or one RM encoder) is used, this is called single RM. If A>11, since two RM block codes (or two RM encoders) are used, this is called dual RM.

Now, UCI transmission is described according to an embodiment of the present invention.

Multiple serving cells may be activated for a wireless device, and CSI/RS for the multiple serving cells may be transmitted on a PUCCH or a PUSCH.

A periodic CSI report may be configured, and a CSI report for the multiple serving cells may be triggered in one UL subframe. This is called a collision of the CSI report. When the collision of the CSI report occurs, only CSI for one serving cell is reported, and transmission of the remaining CSI is discarded. This is because the conventional PUCCH format and PUSCH structure do not support the CSI report for the multiple serving cells.

An increase in the number of serving cells may lead to an increase in the collision of the CSI report, and thus the number of times of discarding the CSI report is also increased. The CSI may be not sufficiently reported at a time desired by a BS, and thus it may be difficult for the BS to sufficiently consider a DL channel situation in DL scheduling.

If the CSI for the multiple serving cells is transmitted in one subframe (or one PUCCH or one PUSCH), the CSI report may be prevented from being discarded due to the CSI collision.

However, in order to support the CSI for the multiple serving cells, there is a need to consider a payload of a corresponding channel and to intensify an error detection. For example, if the number of antenna ports is 8, an RI for one serving cell consists of 5 bits. If there are 5 serving cells, the total number of bits of the RI is 25.

An embodiment below proposes a coding scheme and an error detection method according to an increase in the number of bits of UCI.

Although it is assumed hereinafter that the UCI includes an RI and CSI, and a $1^{st}$ UCI is the RI and a $2^{nd}$ UCI is the CSI, this is for exemplary purposes only. The UCI may include a variety of control information such as a precoding type indicator (PTI), etc. The RI may include an RI for one or more serving cells. The CSI may include CSI for one or more serving cells.

FIG. 4 shows UCI coding according to an embodiment of the present invention.

In step S410, a wireless device determines the total number T of $1^{st}$ UCI (e.g., RI) and $2^{nd}$ UCI (e.g., CSI). In step S420, T is compared with a reference value Tr.

In step S430, if T>Tr, the $1^{st}$ UCI and the $2^{nd}$ UCI are coded independently. For example, the $1^{st}$ UCI may be coded on the basis of single RM or dual RM described in the above Equations 6 and 7. The $2^{nd}$ UCI may be coded on the basis of the (32, 0) block code of Table 2.

In step S440, if T<=Tr, the $1^{st}$ UCI and the $2^{nd}$ UCI are coded as single UCI. For example, the $1^{st}$ UCI may be coded on the basis of single RM or dual RM described in the above Equations 6 and 7.

The coded UCI may be transmitted on a PUCCH or a PUSCH.

Tr is not particularly limited, and may be 15 for example. Tr may be given by a BS. If the total number of bits of the UCI to be transmitted is greater than 15, the $1^{st}$ UCI including an RI and the $2^{nd}$ UCI including information other than the RI are coded independently.

If the UCI is transmitted through the PUSCH, an additional resource allocation is required to apply independent coding. One of the remaining OFDM symbols other than an OFDM symbol reserved for a demodulation reference signal (DM RS), HARQ ACK/NACK, and an SRS may be additionally allocated to the RI. The wireless device may change the number of subcarriers to which the UCI is to be mapped in a corresponding OFDM symbol by considering the number of bits of the CSI and/or the RI.

Figure 5:
FIG. 5 shows UCI coding according to another embodiment of the present invention.
Figure 5:
Figure 5:
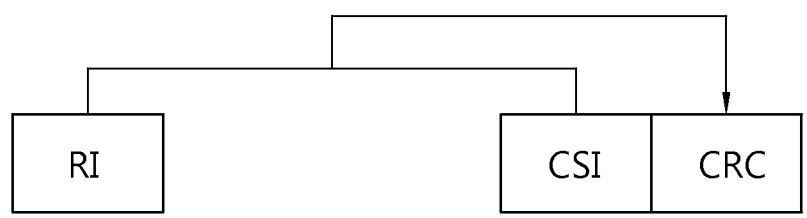

FIG. 5 shows UCI coding according to another embodiment of the present invention.

The total number of bits of UCI may vary depending on the number of bits of an RI. In particular, a reception error of the RI may cause a deterioration of a DL throughput. Therefore, it is proposed to attach an additional error detection code to improve an error detection performance of the UCI.

The error detection code may include a parity bit having one or more bits and/or a cyclic redundancy check (CRC) having one or more bits.

Case (A) shows an example of attaching a parity bit to an RI. The RI having the parity bit and CSI are coded independently. The RI and the CSI may be coded with different encoding schemes. On the basis of the aforementioned (20, A) RM code or (32, A) RM code, single RM or dual RM or triple or more RM may be used as a coding scheme. For example, when the dual RM is applied on the basis of the (20, A) RM code of Table 3, an RI of up to 26 bits may be coded. Alternatively, when the triple RM is applied on the basis of the (20, A) RM code of Table 3, an RI of up to 39 bits may be coded. There is no restriction on the coding scheme, and well-known coding such as tail-biting convolutional coding (TBCC) may be applied.

In Case (B), a parity bit is generated on the basis of an RI, but the parity bit is attached to CSI. The RI and the CSI to which the parity bit is attached are coded independently. The RI and the CSI may be coded with different encoding schemes. On the basis of the aforementioned (20, A) RM code or (32, A) RM code, single RM or dual RM may be used as a coding scheme. Alternatively, when the triple RM is applied on the basis of the (20, A) RM code of Table 3, an RI of up to 39 bits may be coded. There is no restriction on the coding scheme, and well-known coding such as TBCC may be applied.

In Case (C), a CRC is generated on the basis of an RI and CSI. The CRC is attached to the CSI. The RI and the CSI to which the CRC is attached are coded independently. The RI and the CSI may be coded with different encoding schemes. On the basis of the aforementioned (20, A) RM code or (32, A) RM code, single RM or dual RM may be used as a coding scheme. Alternatively, when triple RM is applied on the basis of the (20, A) RM code of Table 3, an RI of up to 39 bits may be coded. There is no restriction on the coding scheme, and well-known coding such as TBCC may be applied.

The coded UCI may be transmitted through one or more UL channels. The independently encoded RI and CSI may be transmitted through one UL channel. The UL channel may include a PUCCH (e.g., a PUCCH format 3) or a PUSCH.

The error detection code may be attached when the number of bits of the UCI is greater than or equal to a specific value. For example, if the number of bits of the UCI (or the number of bits of the RI) is greater than Tr, the error detection code may be attached.

The embodiment of FIG. 5 may be combined with the embodiment of FIG. 4. If the number of bits of the UCI to which the error detection code is attached is greater than Tr, the UCI to which the error detection code is attached and UCI to which the error detection code is not attached may be encoded independently.

Figure 6:
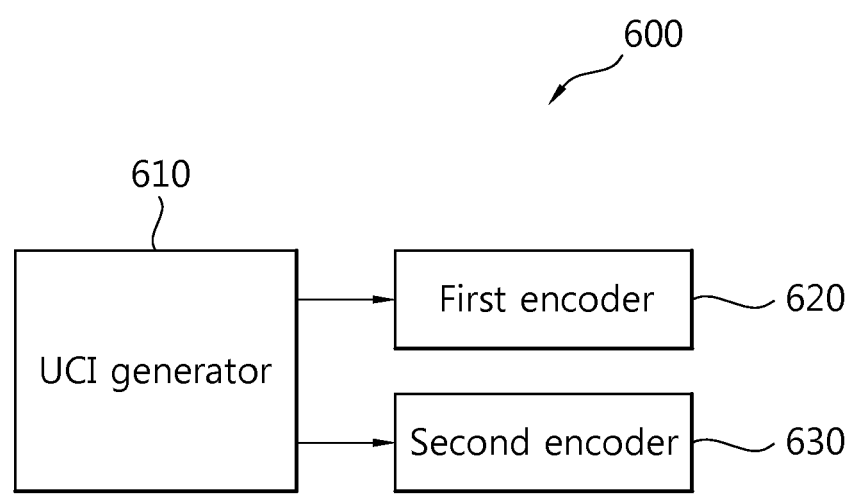
FIG. 6 is a block diagram showing an encoding apparatus according to an embodiment of the present invention.

FIG. 6 is a block diagram showing an encoding apparatus according to an embodiment of the present invention. The encoding apparatus implements the embodiments of FIG. 4 and FIG. 5.

An encoding apparatus 600 includes a UCI generator 610, a $1^{st}$ encoder 620, and a $2^{nd}$ encoder 630. The UCI generator 610 generates UCI, and attaches an error detection code thereto. When the UCI includes $1^{st}$ UCI and $2^{nd}$ UCI, an error detection code for the $1^{st}$ UCI may be attached to the $2^{nd}$ UCI.

The 1$^{st}$ encoder 620 encodes the 1$^{st}$ UCI. The 2$^{nd}$ encoder 630 encodes the 2$^{nd}$ UCI. The 1$^{st}$ encoder 620 and the 2$^{nd}$ encoder 630 may perform single RM or dual RM on the basis of a (20, A) RM code or a (32, A) RM code.

Figure 7:
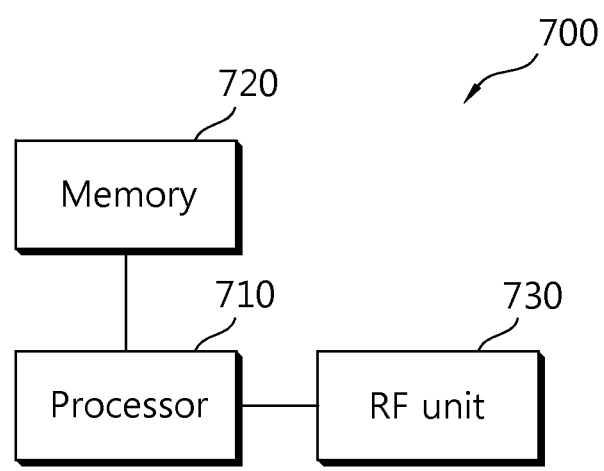
FIG. 7 is a block diagram of a wireless device according to an embodiment of the present invention.

FIG. 7 is a block diagram of a wireless device according to an embodiment of the present invention.

A wireless device 700 includes a processor 710, a memory 720, and a radio frequency (RF) unit 730.

The memory 720 is coupled with the processor 710, and stores instructions executed by the processor 710. When the encoding schemes of FIG. 4 and FIG. 5 are implemented with software, an instruction for executing the software may be stored in the memory 720.

The RF unit 730 is coupled with the processor 710, and transmits and/or receives a radio signal. UCI may be transmitted on a PUCCH or a PUSCH by the RF unit 730.

The processor 710 implements the proposed functions, procedure, and/or methods. In the aforementioned embodiment, an operation of the wireless device 700 may be implemented by the processor 710.

The processor may include an application-specific integrated circuit (ASIC), a separate chipset, a logic circuit, and/or a data processing unit. The memory may include a read-only memory (ROM), a random access memory (RAM), a flash memory, a memory card, a storage medium, and/or other equivalent storage devices. The RF unit may include a baseband circuit for processing a radio signal. When the embodiment of the present invention is implemented in software, the aforementioned methods can be implemented with a module (i.e., process, function, etc.) for performing the aforementioned functions. The module may be stored in the memory and may be performed by the processor. The memory may be located inside or outside the processor, and may be coupled to the processor by using various well-known means.

Although the aforementioned exemplary system has been described on the basis of a flowchart in which steps or blocks are listed in sequence, the steps of the present invention are not limited to a certain order. Therefore, a certain step may be performed in a different step or in a different order or concurrently with respect to that described above. Further, it will be understood by those ordinary skilled in the art that the steps of the flowcharts are not exclusive. Rather, another step may be included therein or one or more steps may be deleted within the scope of the present invention.

What is claimed is:

1. An encoding method in a wireless communication system, the method comprising:
   generating an error detection code for first uplink control information (UCI);
   attaching the error detection code to second UCI;
   encoding the first UCI; and
   encoding the second UCI to which the error detection code is attached.

2. The method of claim 1, wherein the error detection code includes a parity bit or a cyclic redundancy check (CRC).

3. The method of claim 1, wherein the first UCI and the second UCI are encoded based on different Reed-Muller (RM) codes.

4. The method of claim 3, wherein the first UCI is encoded based on a (20, A) RM code, and the second UCI is encoded based on a (32, A) RM code, where A is the number of bits of UCI which is input to an encoder.

5. The method of claim 3, wherein the first UCI is encoded based on a (32, A) RM code, and the second UCI is encoded based on a (20, A) RM code.

6. The method of claim 1, wherein the first UCI includes a rank indicator (RI), and the second UCI includes channel state information (CSI).

7. The method of claim 1, wherein the encoded first UCI and the encoded second UCI are transmitted through one uplink channel.

8. The method of claim 7, wherein the uplink channel includes a physical uplink shared channel (PUSCH) or a physical uplink control channel (PUCCH).

9. An encoding apparatus in a wireless communication system, the apparatus comprising:
   an uplink control information (UCI) generator configured to generate an error detection code for first UCI, and attach the error detection code to second UCI;
   a first encoder configured to encode the first UCI; and
   a second encoder configured to encode the second UCI to which the error detection code is attached.

10. The apparatus of claim 9, wherein the error detection code includes a parity bit or a cyclic redundancy check (CRC).

11. The apparatus of claim 9, wherein the first UCI and the second UCI are encoded based on different Reed-Muller (RM) codes.

12. The apparatus of claim 9, wherein the first UCI includes a rank indicator (RI), and the second UCI includes channel state information (CSI).

13. The apparatus of claim 9, wherein the encoded first UCI and the encoded second UCI are transmitted through one uplink channel.

* * * * *